United States Patent [19]
Aoba et al.

[11] Patent Number: 6,154,112
[45] Date of Patent: Nov. 28, 2000

[54] CHIP INDUCTOR

[75] Inventors: Hideo Aoba, Maebashi; Kazuhiko Otsuka, Gunma-machi; Kei Chigira, Shibukawa, all of Japan

[73] Assignee: Taiyo Yuden Co., Ltd., Tokyo, Japan

[21] Appl. No.: 09/350,179

[22] Filed: Jul. 9, 1999

[30] Foreign Application Priority Data

Jul. 13, 1998 [JP] Japan .................................. 10-197840

[51] Int. Cl.$^7$ .................................................. H01F 27/29
[52] U.S. Cl. .............................. 336/192; 336/96; 336/200; 336/185
[58] Field of Search ..................................... 336/192, 200, 336/196, 185, 232, 96, 208, 223

[56] References Cited

U.S. PATENT DOCUMENTS

| | | | |
|---|---|---|---|
| 4,595,901 | 6/1986 | Yahagi | 336/192 |
| 5,572,180 | 11/1996 | Huang et al. | 336/200 |
| 5,764,126 | 6/1998 | Kanetaka et al. | 336/96 |
| 5,963,119 | 10/1999 | Takeda et al. | 336/206 |

*Primary Examiner*—Lincoln Donovan
*Assistant Examiner*—Tuyen Nguyen
*Attorney, Agent, or Firm*—Townsend & Banta

[57] ABSTRACT

A winding-type chip inductor having an approximately rectangular parallelepiped shape and improved appearance is provided having external electrodes installed directly on a core which is adaptable to a bulk mounting of one-by-one system by a chip mounter. This chip inductor comprises a core consisting of a winding core and rectangular flanges, a first conductive film layer installed directly on the flanges, a winding wound around the winding core with both ends of the winding conductively fixed to the first conductive film layer, and an external covering material covering the outer periphery of the winding and shaped in a rectangular fashion.

7 Claims, 6 Drawing Sheets

PRIOR ART

PRIOR ART

CHIP INDUCTOR

BACKGROUND OF THE INVENTION

The present invention relates to a chip inductor to be mounted on the surface of a printed circuit board, and, more particularly, to a structure of a chip inductor equipped with external electrodes installed directly on a core which is adaptable to a bulk mounting of one-by-one system by a chip mounter.

DESCRIPTION OF THE PRIOR ART

In order to achieve a high-density surface mounting of parts onto a printed circuit board using a chip mounter, manufacturers have progressively reduced the size and thickness of electronic part chips, such as resistor elements, capacitors, etc. For instance, as shown in FIGS. 5(A) and 5(B), a chip inductor of a structure for winding a winding or coil around a winding core (a winding type chip inductor) has a chip inductor 10 wherein both ends of a winding 8 are wound around a winding core 1 of a drum-shaped core 7 and connected to external electrodes 5 prepared by lead frames fixed on external surfaces of flanges 2 of the core 7. The drum-shaped core 7 and the external electrodes 5 are covered with an external covering material 9 (a synthetic resin) formed into a rectangular parallelepiped shape, and L-shaped parts in front of the external electrodes 5 are exposed to both circumferential side surfaces and the lower surface of the external covering material 9.

However, with the above-described prior art winding-type chip inductor 10 shown in FIGS. 5(a) and 5(b), the external electrodes 5 are positioned on the lower side of the external covering material 9, and there is at least up and down directivity in the chip. With this configuration, it is impossible to perform bulk mounting of a one-by-one system by the chip mounter. Further, the chip inductor 10 is undesirably large in size, unlike the capacitor.

A compact and thin-type chip inductor has been previously disclosed by an applicant of the present invention in Japanese Patent Application Laid-open No. 9-306744. According to that Japanese application, chip inductor having an inductor main body has a core wherein the winding core is laid laterally, and the external electrodes are installed directly on both (approximately rectangular) flanges of the core. An external covering material is applied over the whole outer periphery of the inductor main body, so that the chip inductor has a rectangular surface shape.

As shown in FIGS. 6(A) and 6(B), a chip inductor 20, as described in Japanese Patent Application Laid-open No. 9-306744, comprises a core 17, a cylinder-shaped winding core 11 having an approximately circular cross section, approximately rectangular flanges 12 integrally formed with the winding core 11 on both ends of the winding core 11 in its axial direction, and external electrodes 15 installed directly on a core prepared as a first conductive film layer 14 formed on both end surfaces 12a and circumferential side surfaces 12b of both flanges 12.

A winding 18 is wound around the winding core 11 of the core 12, with both ends of the winding 18 conductively fixed to the external electrodes 15, which are installed directly on the core. An external covering material 19 formed on the whole circumference of the external peripheral surface of the winding 18 is wound around the winding core 11, so that the surface shape of the outer covering material 19 has a rectangular shape.

The core 17 used for the above described chip inductor 20 is made of, for example, a magnetic material such as nickel zinc ferrite having high resistivity, or an insulator such as alumina. Using such a core 17, it is possible to apply the first conductive film layers 14 as the external electrodes 15 directly onto the core. The first conductive film layers 14 are formed of a conductive material such as silver, silver-palladium, copper coated with nickel, lead-tin, or the like, by dip baking or plating. The external covering material 19 is an epoxy group synthetic resin coated by potting or by transfer.

The winding 18 is an insulated conductive line with a diameter of about 0.03 to 0.15 mm, wherein polyurethane or polyamideimide are used as the insulating material. Both ends of the wiring 18 are guided out to the external electrodes 15 through grooves 16 provided on the circumferential side surfaces 12b of the flanges 12, and are connected to the external electrodes 15 by welding, thermocompression bonding, or ultrasonic bonding, or by use of a combination of the three techniques.

The winding core 11 of the core 17 of the above-mentioned chip inductor is laid laterally, and the external electrodes 15 are directly installed on the end surfaces 12a and the circumferential side surfaces 12b of the flanges 12 at both ends of the core 17. Further, the external covering material 19 is applied on the outer peripheral surface of the winding 18, and shaped into a rectangular shape. Thus, it is possible to obtain the chip inductor 20, which is extremely small in size and thickness, and which is based on the standard RC-3402 laminated layer porcelain capacitor of the Japan Electronic Industry Association.

Although the above-described chip inductor 20 based on the standard RC-3402 is small in size and thickness, uneven surfaces of conductively fixed electrodes 15 are exposed to the outside of the chip inductor, even though these conductive portions 2 exist inside the grooves 16 provided on the flanges 12. Occasionally, this causes the conductively fixed portions Z to extend out above the rectangular surfaces of the external electrodes 15 and, accordingly, the chip inductor is incorrectly mounted in a slanted state when the circumferential side surfaces on which the conductively fixed portions Z are positioned downward during mounting of the chip inductor on a printed substrate.

Furthermore, although the chip inductor has a chip shape, the surface of the external covering material 19 is recessed from the circumferential side surfaces 12b of both flanges 12, and this recessed gap between the two opposing flanges 12 is not embedded completely. In other words, there is a visually observable gap at borders between the circumferential side surfaces 12b of the flanges 12 and the external covering material 19. Thus, the chip inductor does not have a perfectly rectangular parallelepiped shape, causing a problem during the actual mounting operation at the time of absorbing and the like. In addition, the recognizable unevenness of the conductively fixed portions Z of the chip inductor 20 is an undesirable characteristic of a chip part.

Moreover, in general, the synthetic resin used as the external covering material 19 and the ferrite material used for forming the core 17 have different coefficients of thermal expansion. These differing coefficients of thermal expansion allow an opening or crevice to form at the border S between the external covering material 19 and inner side surfaces 12C of the flanges 12 (a boundary surface continuing from the winding core 11). Such an opening or crevice allows the transit portion of the winding from the winding wound-up portion to the conductively fixed portion to be undesirably exposed.

SUMMARY OF THE INVENTION

The present invention has been made in view of solving the above-mentioned deficiencies of the prior art devices. In particular, it is an object of the present invention to provide an improved chip inductor which is to be bulk mounted in a one-by-one system, and which is equipped with external electrodes directly installed on the flanges of the core having a laterally laid-out winding core and an external covering material covering the whole outer periphery of the winding.

According to a first embodiment of the present invention, in order to achieve the above object, there is provided a chip inductor comprising a core having a winding core, and rectangular flanges integrally formed with the winding core on both ends of the winding core in its axial direction. External electrodes are installed directly on the core, and prepared by a first conductive film layer formed on both end surfaces and circumferential side surfaces respectively of both flanges of the core.

A winding is provided, which is wound around the winding core of the core, with both ends of the winding conductively fixed to the external electrodes installed directly on the core, and an external covering material covers the external peripheral surface of the winding wound around the winding core, wherein the external covering material is embedded into a gap between both flanges, both ends of the external covering material at both flange sides are superimposed on the first conductive film layer on the circumferential side surfaces of the flanges, and both ends of a second conductive film layer are laminated on the first conductive film layer so as to be superimposed on the external covering material of the flanges.

According to a second aspect of the invention, in order to achieve the above object, there is provided a chip inductor as described in the first embodiment above, wherein the external covering material superimposed on the first conductive film layer covers a transit portion of the winding from the winding wound-up portion to the conductively fixed portion.

In a third embodiment of the present invention, in order to achieve the above object, there is provided a chip inductor as described in the first and second embodiments above, wherein the ends of the second conductive film layer superimposed on the external covering material extend over the circumferential side surface of the flanges and reach an area where the winding is wound.

In a fourth embodiment of the invention, in order to achieve the above object, there is provided a chip inductor as described in the first and second embodiments above, wherein the second conductive film layer is embedded into the conductively fixed portion at which the winding is fixed to the first conductive film layer, the surface of the second conductive film layer on the conductively fixed portion being shaped flat.

In a fifth embodiment of the present invention, in order to achieve the above object, there is provided a chip inductor as described in the third embodiment above, wherein the second conductive film layer is embedded into the conductively fixed portion at which the winding is fixed to the first conductive film layer, the surface of the second conductive film layer on the conductively fixed portion being shaped flat.

As described in the first through fifth embodiments above, the external electrodes have a two-layer structure, wherein the first conductive film layer, the second conductive film layer, and the conductively fixed portions are completely embedded, thereby providing a chip inductor having a desirable rectangular parallelepiped shape similar to a multilayer ceramic capacitor having no up and down directivity. Thus, bulk mounting of a one-by-one system by a chip mounter is possible using the chip inductor of the present invention. Further, by having the external covering material superimposed upon the second conductive film layer, a reduction in the quality of the appearance of the chip inductor attributable to a thermal expansion or compression can be prevented.

DETAILED DESCRIPTION OF THE INVENTION

Figure 1:
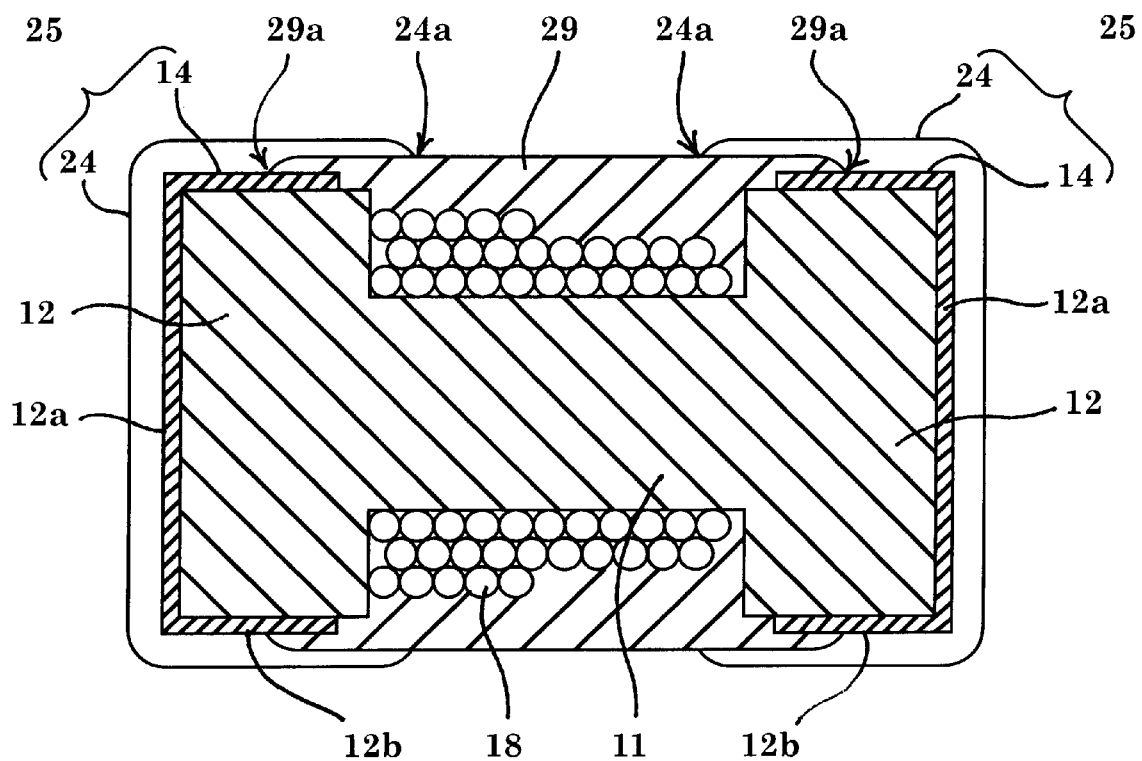
FIG. 1 is a cross-sectional view of the chip inductor of the present invention.
Figure 2:
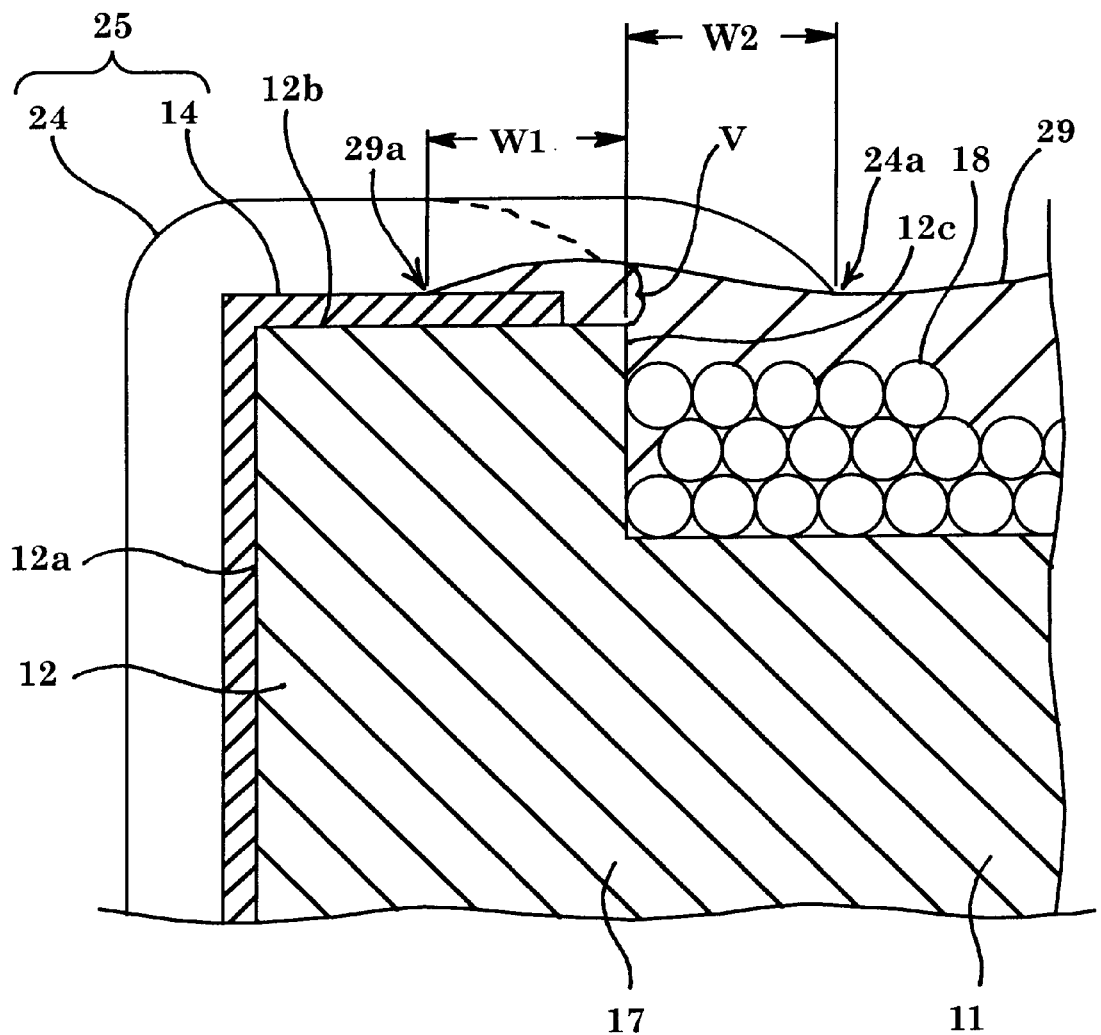
FIG. 2 is an enlarged partial cross-sectional view partially cut away of the chip inductor of the present invention, illustrating an overlap configuration of external electrodes with an external covering material on the circumferential side surfaces of flanges of the chip inductor.
Figure 3A:
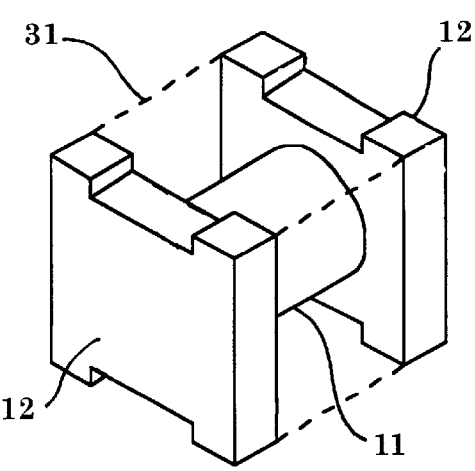
FIG. 3(a) is a perspective view of the chip inductor of the present invention, illustrating the first step in the manufacturing process of the chip inductor.
Figure 3C:
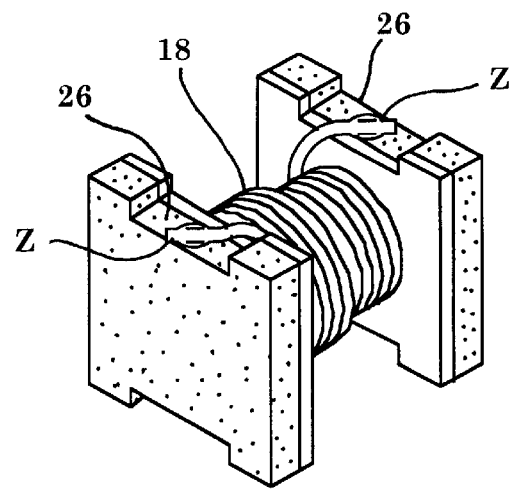
FIG. 3(c) is a perspective view of the chip inductor of the present invention, illustrating the third step in the manufacturing process of the chip inductor.
Figure 3B:
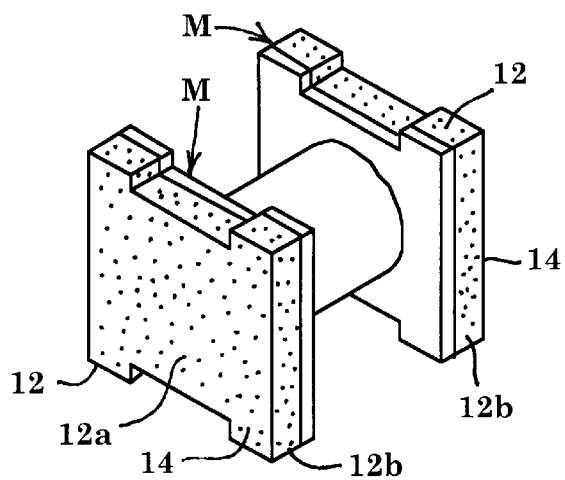
FIG. 3(b) is a perspective view of the chip inductor of the present invention, illustrating the second step in the manufacturing process of the chip inductor.
Figure 3D:
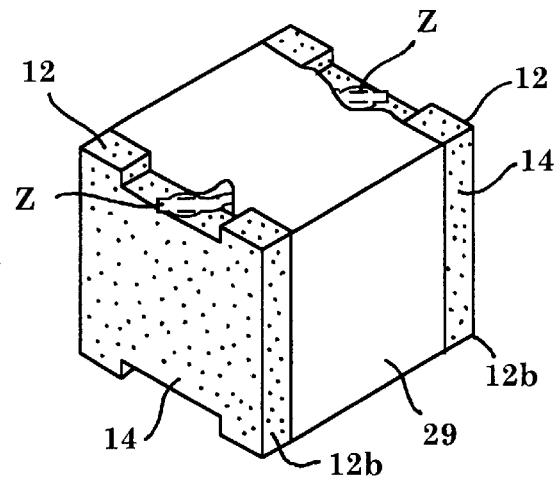
FIG. 3(d) is a perspective view of the chip inductor of the present invention, illustrating the fourth step in the manufacturing process of the chip inductor.
Figure 3E:
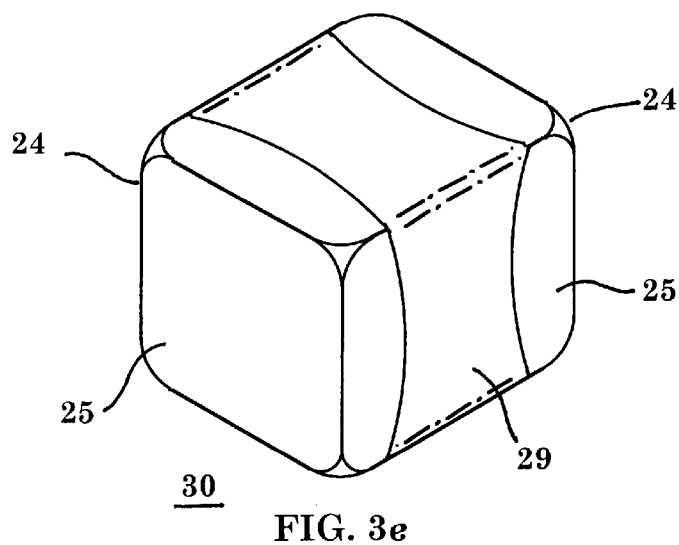
FIG. 3(e) is a perspective view of the chip inductor of the present invention, illustrating the fifth step in the manufacturing process of the chip inductor.

As shown in FIGS. 1 and 2, a chip inductor 30 comprises a core 17 having a winding core 11, rectangular flanges 12 integrally formed with the winding core 11 on both ends thereof in its axial direction, and a first conductive film layer 14 formed on both end surfaces 12a and circumferential side surfaces 12b of both flanges 12.

A winding 18 is wound around the winding core 11 of the core 17, with both ends of the winding 18 conductively fixed to the first conductive film layer 14 installed directly on the core, and an external covering material formed into a rectangular shape covers the whole circumference of the external peripheral surface of the winding 18 wound around the winding core 11.

The chip inductor of the present invention differs in part from the prior art examples previously discussed in that an external covering material 29 is embedded into a gap between both flanges 12 and 12 such that the external covering material 29 is formed into an approximately matching flat surface to match the shape of the circumferential side surfaces of the flanges 12.

By forming ends 29a of the external covering material 29 at both flange sides to extend to the first conductive film layer 14 of the circumferential side surfaces 12b of the flanges 12 so as to be superimposed on the circumferential side surface 12b (W1 denotes the width of the superimposition, which is not limited to a constant value), a flat surface is obtained.

Then, both ends of a newly-provided second conductive film layer 24 are laminated on the first conductive film layer 14 so as to be superimposed on the ends 29a of the external covering material 29 of the flanges 12 (the width of superimposition=W1+W2, as shown in FIG. 2). The width of superimposition W1 may be equal to only a part of the circumferential side surface 12b, instead of the whole periphery of the circumferential side surface 12b. Such a situation is illustrated in FIG. 4.

As the second conductive film layer 24, for example, a resin paste including silver may be used. A synthetic resin material to be used for the external covering material 29 may include epoxy resin, phenol resin, silicone resin, or the like.

As described above, by completely covering and shaping the external covering material 29 in the gap between the flanges 12 and 12 so as to extend over the circumferential side surfaces 12b of the flanges 12, an approximately rectangular parallel-pipe shaped chip can be obtained having a smooth flat outer surface. If the external covering material 29 is extended to and is superimposed on the circumferential side surfaces 12b of the flanges 12 (with the superimposition width W1), as in the present invention, exposure of a gap V between the external covering material 29 and the flanges 12 is avoided.

Figure 4:
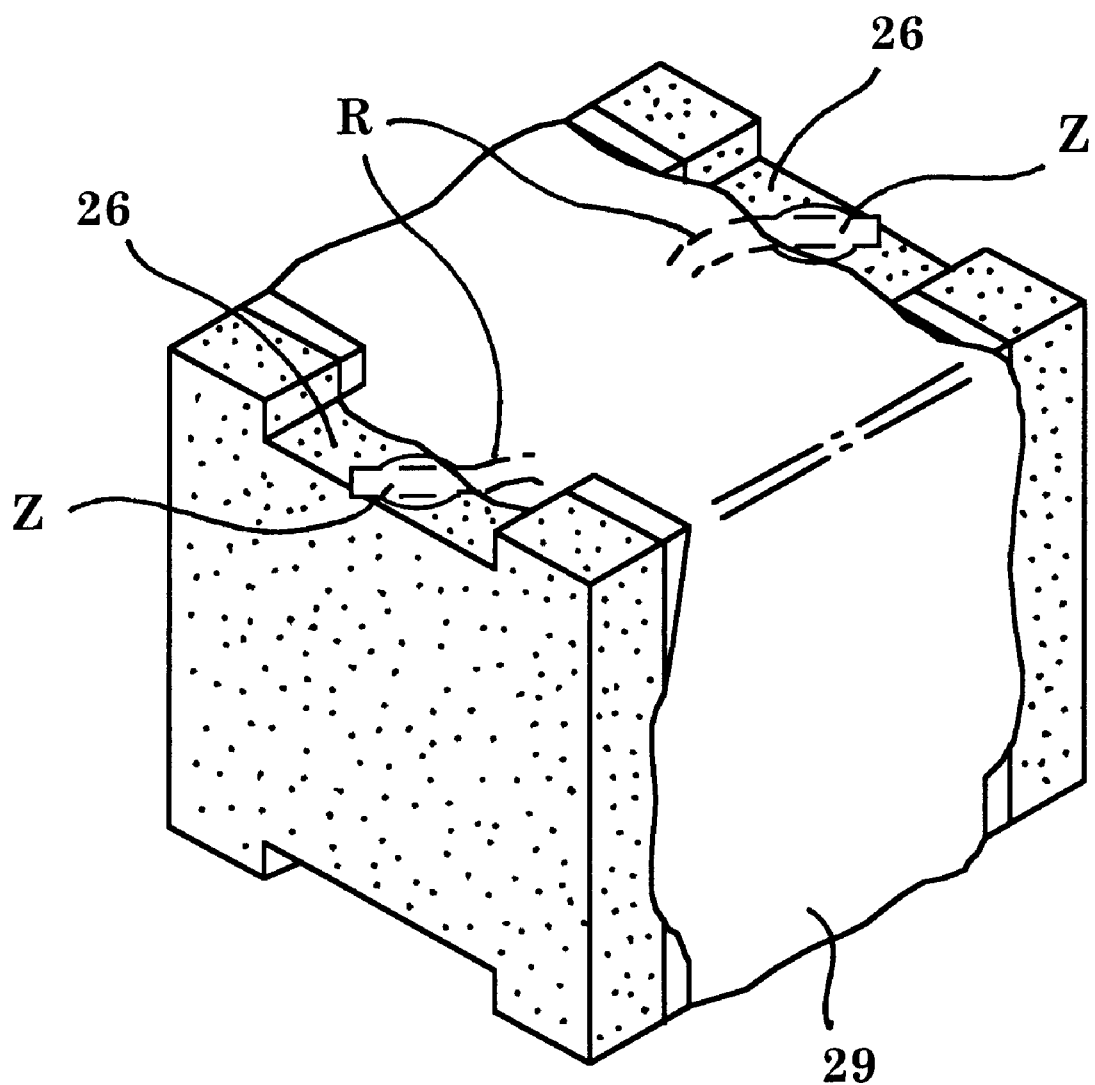
FIG. 4 is a perspective view of the chip inductor of the present invention, illustrating the shape of the external coating material, as described in the second embodiment of the present invention.
Figure 5A:
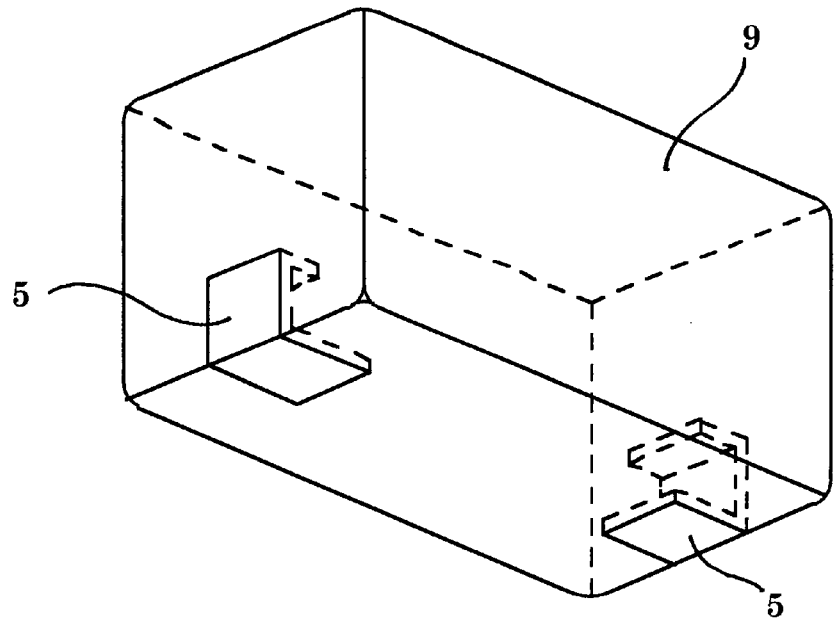
FIG. 5(A) is a perspective view of a prior-art chip inductor.
Figure 5B:
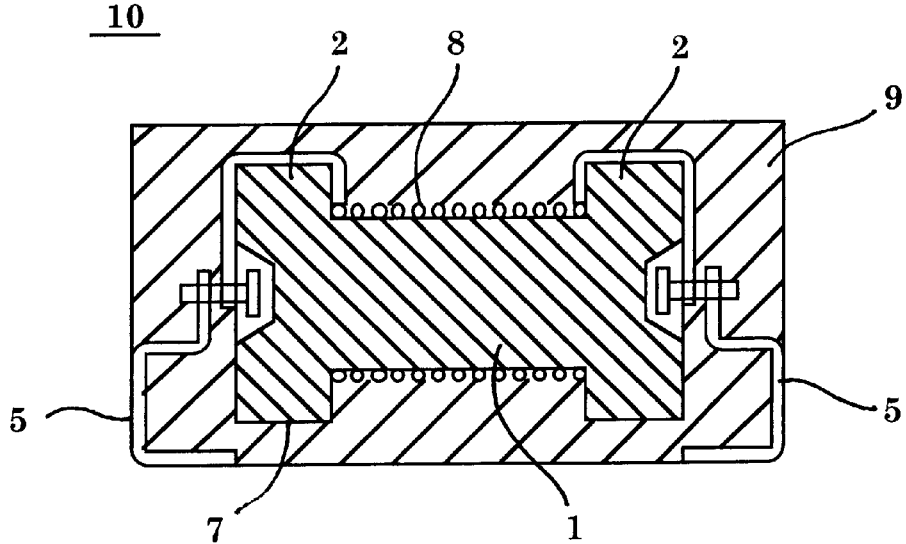
FIG. 5(B) is a cross-sectional view of a prior art chip inductor.
Figure 6A:
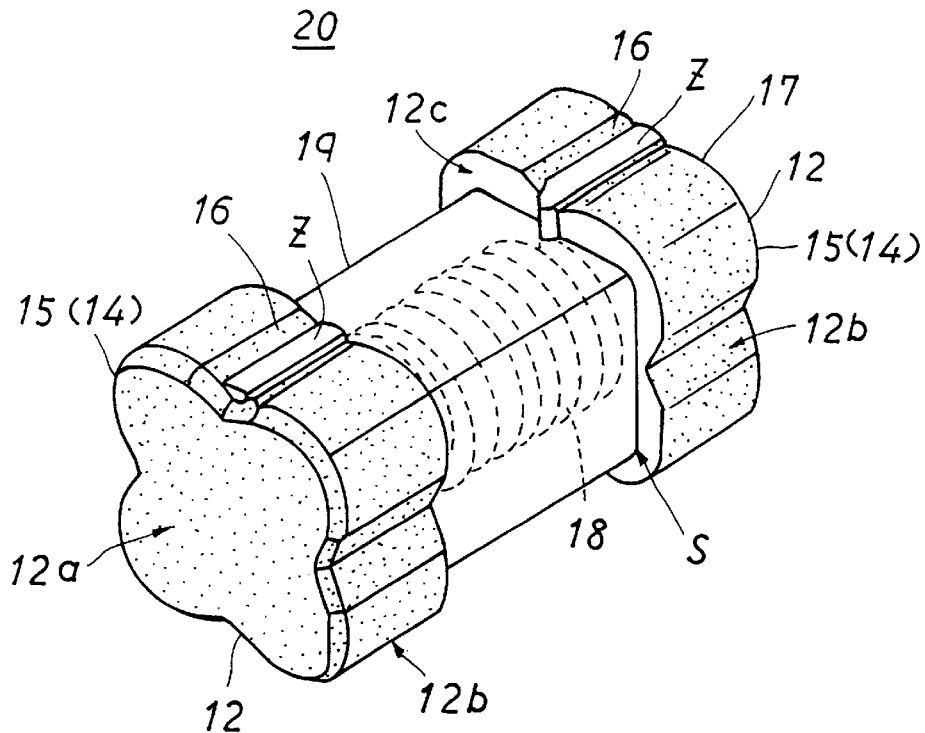
FIG. 6(A) is a perspective view of another prior art chip-shaped chip inductor, as described in Japanese Patent Application Laid-open No. 9-306744.
Figure 6B:
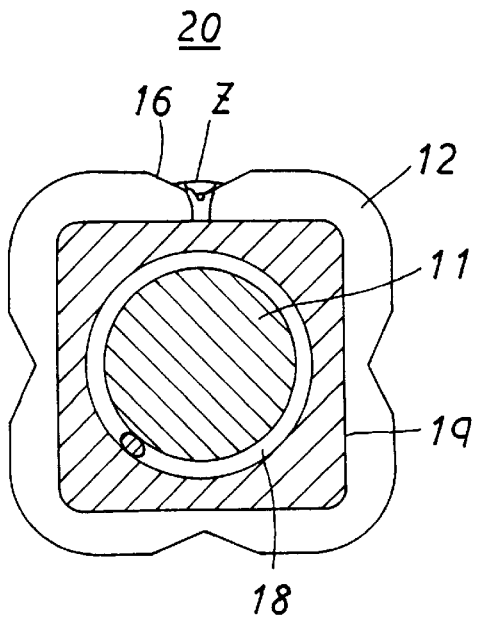
FIG. 6(B) is a cross-sectional view of the prior art chip-shaped chip inductor shown in FIG. 6(A).

Further, when the external covering material 29 covers the transit portion R of the winding from the winding wound-up portion to conductively fixed portions Z, as shown in FIG. 4, the problem of the exposure of the transit portion to the conductive fixed portion is successfully avoided.

When the end 24a of the second conductive film layer 24 is formed to be superimposed upon the external covering material 29, and is extended beyond the circumferential side surface 12b of the flange 12 and is superimposed on the area of the external covering material 29 above the winding core 11 (with the superimposition width W2 above the winding core), widening of the gap V at the interface between the ferrite core 17 and the synthetic resin of the external covering material 29 can be avoided, which occurs due to the difference in coefficients of thermal expansion between these members.

This effect is obtained as the second conductive film layer 24 superimposed on the area of the external covering material 29 above the winding core 11 firmly holds the external covering material 29 and suppresses the gap V at the interface (on the extension of the inner side surface 12c of the flanges 12).

When the thickness of the second conductive film layer 24 is increased at the groove portion of the flanges 12, and the transit portion of the winding from the winding wound-up portion to the conductively fixed portions Z is completely embedded in this groove to have a flat upper surface of the second conductive film layer 24, the chip inductor attains a rectangular parallel-piped shape, substantially similar to the shape of a laminated chip inductor, although there is a slight swell at the flange portions. This makes it possible to achieve a satisfactory surface mounting of a one-by-one system by a chip mounter.

In the case of a two-terminal inductor element having no polarity, such as a choke coil, a filter or the like (excluding a transformer), it becomes possible to carry out bulk mounting of an inductor element when the inductor element has an approximately square shape at end surfaces of the flanges 12 of the ferrite core 17 and has no up and down directivity, with one external electrode 25 directly installed on the core provided in both flanges.

A manufacturing process of the chip inductor 30 according to the present invention, as shown in FIGS. 3(a)-3(e), comprises the following steps:

(a) A rectangular dry-formed ferrite material 31 is internally ground to form a circular winding core 11, which is then sintered.

(b) A first conductive film layer 14 is formed directly on end surfaces 12a and circumferential side surfaces 12b of rectangular flanges 12 and 12.

(c) A winding 18 is wound around core 11, and both ends thereof are conductively fixed (by, for example, thermocompression bonding) in grooves 26 to the first conductive film layer 14 of the circumferential side surfaces 12b of both flanges 12 and 12.

(d) An external covering material 29 such as, for example, epoxy resin or the like, is embedded and shaped into the gap between the flanges 12 and 12 by, for example, potting, so that the external covering material 29 is applied to and covers the whole periphery of the outer circumferential surface of the winding 18 wound around the winding core 11, and along the circumferential side surface shape of the flanges 12 to form a chip inductor having an approximately contiguous flat level surface, and, at the same time, superimposes on the circumferential side surfaces 12b of the flanges 12.

(e) Finally, ends 24a of a second conductive film layer 24 formed of a resin paste including silver are coated on the first conductive film layer 14 so that the ends 24a of the second conductive film layer 24 are superimposed upon the external covering material extending over the circumferential side surface 12b of the flanges 12, and are then baked to form laminated external electrodes 25 consisting of the first conductive film layer 14 and the second conductive film layer 24. Thereafter, external electrode plating, such as tin plating, nickel plating, solder plating, or a combination of these, on the external electrodes 25, may also optionally be performed.

It is also possible to obtain a chip inductor having a high inductance value and shielding properties by using, for the external covering material 29, a resin material including a magnetic powder prepared by mixing a magnetic powder such as ferrite powder or the like into a resin.

From the above, it should be understood that the shape of the chip inductor 30 formed by superimposition of the external covering material 29 on the laminated structure of the external electrodes 25 enables suitable bulk mounting, as well as providing a remarkable improvement in the appearance of the chip inductor 30.

The chip inductor of the present invention, as described above, has the following desirable new and novel characteristics:

(1) The chip inductor described in the first embodiment herein has the external covering material superimposed on the circumferential side surface of the flanges, so that the gap between the flanges and the external covering material is not exposed.

(2) With the chip inductor described in the second embodiment herein, the transit portion of the winding from the winding wound-up portion to the conductively fixed portion is not exposed.

(3) The chip inductor described in embodiment three herein has the ends of the second conductive film layer extended over the circumferential side surfaces of the flanges and superimposed on the area of the external covering material above the winding core, thereby avoiding formation of a gap in the external covering material between the interfaces thereof.

(4) The chip inductor described in the fourth embodiment herein has the conductively fixed portion completely embedded in the second inductive film layer to form a flat surface, the outer shape of the chip inductor thus becoming approximately rectangular parallelepiped in shape. Such a desirable shape enables mountability equivalent to that of a laminated porcelain capacitor, and bulk mounting of a one-by-one system by a chip mounter becomes possible.

DESCRIPTION OF THE REFERENCE NUMERALS 1, 11 winding core
2, 12 flange
2a, 12a end surface of flange
2a, 12b circumferential side surface of flange
12c inner side surface of flange 12
5, 15, 25 external electrode
7 drum-shaped core
8, 18 winding
9, 19, 29 external covering material
10, 20, 30 chip inductor
14 first conductive film layer
16 groove
17 core
24 second conductive film layer
24a end of second conductive film layer
25, 25 laminated external electrodes
26 groove
29 external covering material
29a end of external covering material at both flange sides
30 chip inductor according to the present invention
31 ferrite material
R transit portion R of winding
W1, W2 width of superimposition
Z conductively fixed portion
V gap

What is claimed is:

1. A chip inductor comprising:
a core having a winding core, and rectangular flanges integrally formed at either end of the winding core in its axial direction, said rectangular flanges having end surfaces and circumferential side surfaces;
external electrodes consisting of a first conductive film layer formed on end surfaces and circumferential side surfaces respectively of both rectangular flanges of the core;
a winding wound around the winding core having a wound-up portion and an external peripheral surface thereof, with both ends of the winding conductively fixed to the external electrodes to each form a conductively fixed portion; and
an external covering material for covering the external peripheral surface of the winding wound around the winding core,
wherein the external covering material is embedded into a gap between both flanges, both ends of the external covering material at both flange sides are superimposed on the first conductive film layer on the circumferential side surfaces of the flanges, and both ends of a second conductive film layer are laminated on the first conductive film layer so as to be superimposed on the external covering material of the flanges.

2. The chip inductor according to claim 1, wherein the external covering material superimposed on the first conductive film layer covers a transit portion of the winding from the winding wound-up portion to the conductively fixed portion.

3. The chip inductor according to claim 1, wherein the ends of the second conductive film layer superimposed on the external covering material extend over the circumferential side surfaces of the flanges and the wound-up portion of the winding.

4. The chip inductor according to claim 1, wherein the second conductive film layer is embedded into the conductively fixed portion at which the winding is fixed to the first conductive film layer, the surface of the second conductive film layer on the conductively fixed portion being shaped flat.

5. A chip inductor according to claim 3, wherein the second conductive film layer is embedded into the conductively fixed portion at which the winding is fixed to the first conductive film layer, the surface of the second conductive film layer on the conductively fixed portion being shaped flat.

6. The chip inductor according to claim 2, wherein the ends of the second conductive film layer superimposed on the external covering material extend over the circumferential side surfaces of the flanges and reach an area where the winding is wound.

7. The chip inductor according to claim 2, wherein the second conductive film layer is embedded into the conductively fixed portion at which the winding is fixed to the first conductive film layer, the surface of the second conductive film layer on the conductively fixed portion being shaped flat.

* * * * *